(12) United States Patent
Wu et al.

(10) Patent No.: US 11,552,230 B2
(45) Date of Patent: Jan. 10, 2023

(54) PIXEL ARRAY SUBSTRATE

(71) Applicant: Au Optronics Corporation, Hsinchu (TW)

(72) Inventors: Shang-Jie Wu, Hsinchu (TW); Hao-An Chuang, Hsinchu (TW); Yu-Chieh Kuo, Hsinchu (TW); He-Yi Cheng, Hsinchu (TW); Che-Chia Chang, Hsinchu (TW); Yi-Jung Chen, Hsinchu (TW); Yi-Fan Chen, Hsinchu (TW); Yu-Hsun Chiu, Hsinchu (TW); Mei-Yi Li, Hsinchu (TW); Yu-Chin Wu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 226 days.

(21) Appl. No.: 17/008,607

(22) Filed: Aug. 31, 2020

(65) Prior Publication Data
US 2021/0359180 A1    Nov. 18, 2021

(30) Foreign Application Priority Data

May 14, 2020   (TW) .................................. 109116012

(51) Int. Cl.
*H01L 33/62* (2010.01)
*G09G 3/00* (2006.01)
*G09G 3/32* (2016.01)

(52) U.S. Cl.
CPC ............. *H01L 33/62* (2013.01); *G09G 3/006* (2013.01); *G09G 3/32* (2013.01)

(58) Field of Classification Search
CPC .......... G09G 3/006; G09G 3/32; H01L 33/62
See application file for complete search history.

(56) References Cited

U.S. PATENT DOCUMENTS

| 10,534,399 | B2 | 1/2020 | Lee | |
|---|---|---|---|---|
| 2012/0262184 | A1* | 10/2012 | Shen | ...................... G09G 3/006 324/537 |
| 2018/0173277 | A1 | 6/2018 | Lee | |

FOREIGN PATENT DOCUMENTS

| CN | 106814490 | 6/2017 |
|---|---|---|
| CN | 108155220 | 6/2018 |
| CN | 108206202 | 6/2018 |
| CN | 109658837 | 4/2019 |

* cited by examiner

*Primary Examiner* — Kenneth B Lee, Jr.
(74) *Attorney, Agent, or Firm* — JCIPRNET

(57) ABSTRACT

A pixel array substrate includes a base, pixel structures, first bonding pads, first wirings, and a first testing element. The pixel structures are disposed on an active area of a first surface of the base. The first bonding pads are disposed on a peripheral region of the first surface. Each of the first wirings is disposed on a corresponding first bonding pad, a first sidewall of the base, and a corresponding second bonding pad. The first testing element is disposed on the active area of the first surface and has a first testing line. The first testing line is electrically connected to at least one of the first bonding pads, and an end of the first testing line is substantially aligned with an edge of the base.

14 Claims, 10 Drawing Sheets

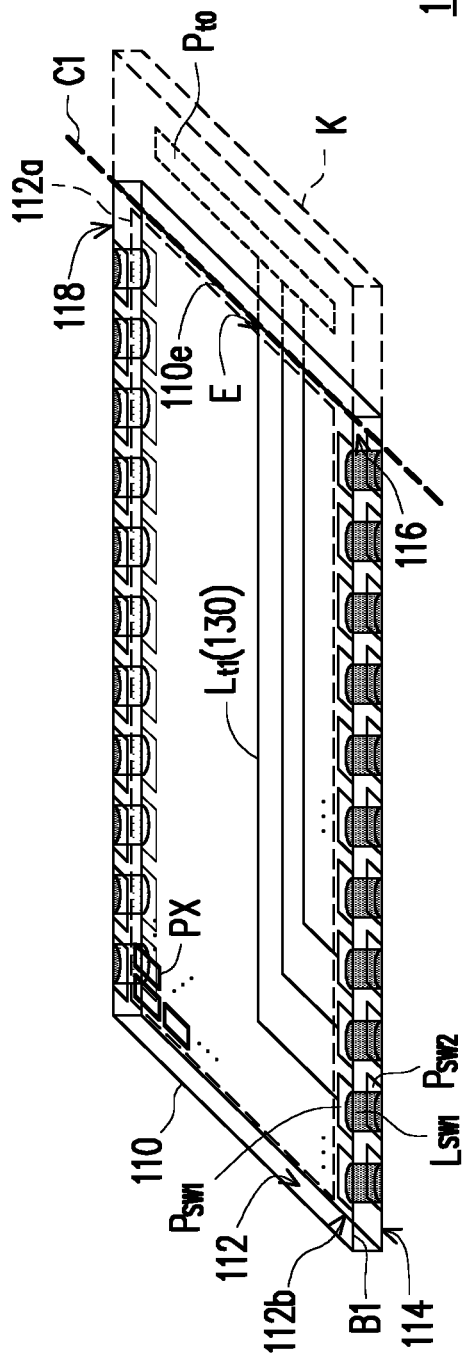
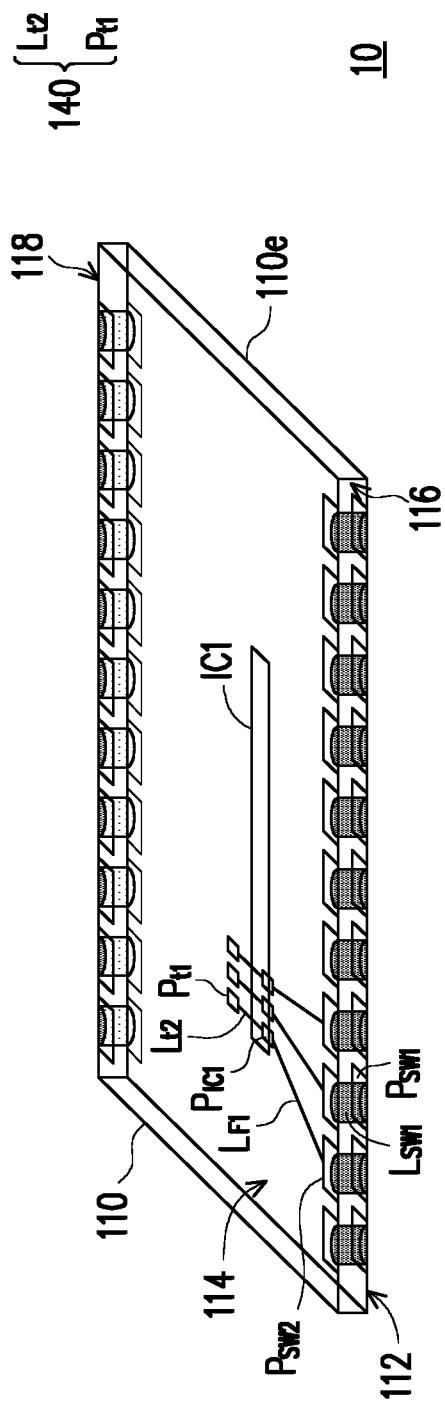
FIG. 1A
FIG. 1B

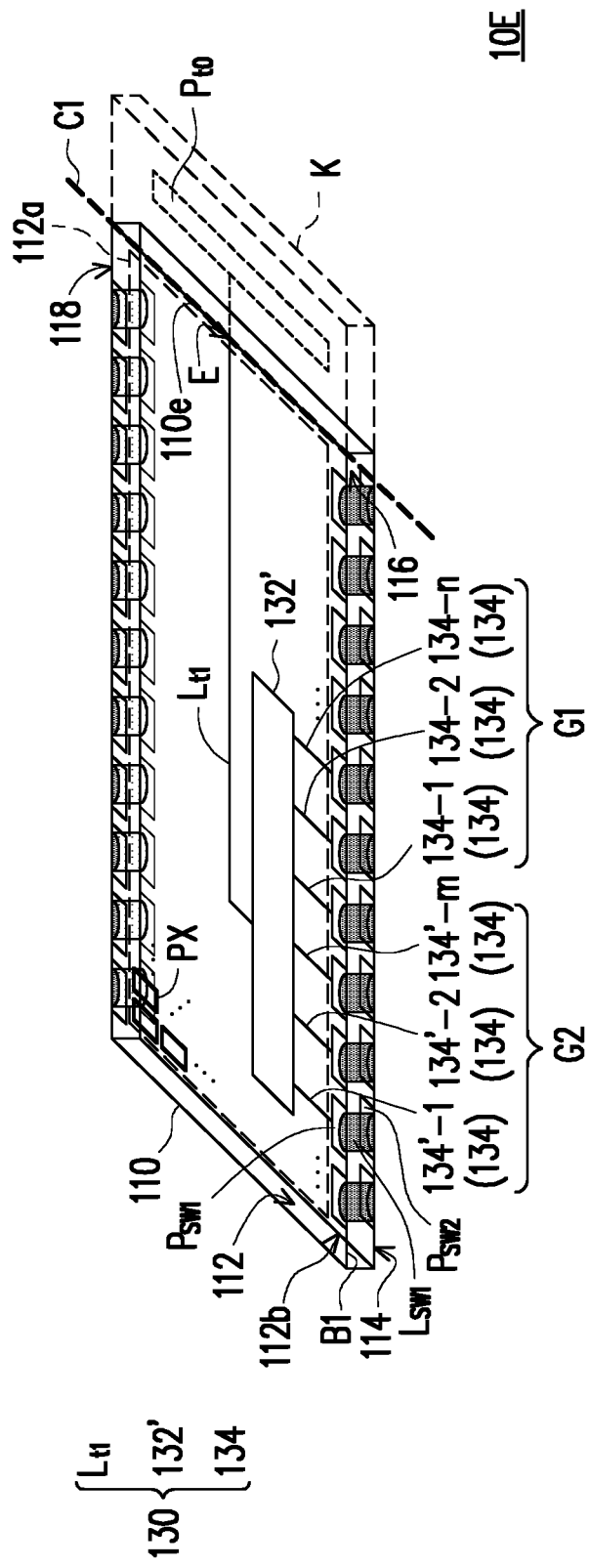
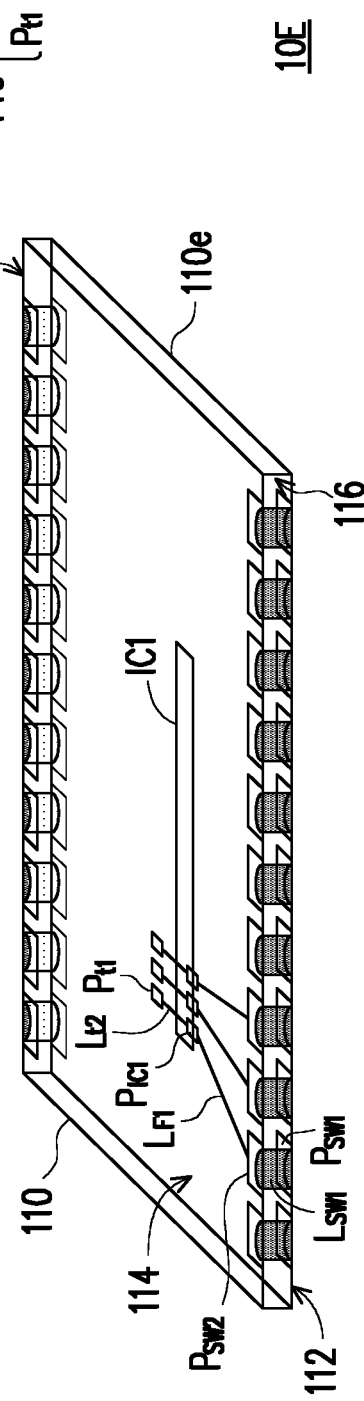
FIG. 8A
FIG. 8B

PIXEL ARRAY SUBSTRATE

CROSS-REFERENCE TO RELATED APPLICATION

This application claims the priority benefit of Taiwan application serial no. 109116012, filed on May 14, 2020. The entirety of the above-mentioned patent application is hereby incorporated by reference herein and made a part of this specification.

BACKGROUND OF THE INVENTION

Field of the Invention

The invention relates to a pixel array substrate.

Description of Related Art

A light-emitting diode display panel includes a pixel array substrate. The pixel array substrate includes a plurality of pixel structures, wherein each pixel structure has a light-emitting diode element. Inheriting the characteristics of light-emitting diodes, the light-emitting diode display panel has advantages such as power saving, high efficiency, high brightness, and fast response time. In addition, compared with an organic light-emitting diode display panel, the light-emitting diode display panel also has advantages such as easy color adjustment, long light-emitting life, and no image burn-in. Therefore, the light-emitting diode display panel is regarded as the next generation of display technology.

In order to realize a narrow frame or even frameless light-emitting diode display panel, the driver chip is disposed on the back surface of the light-emitting diode display panel, and the driver chip disposed on the back surface and the pixel structures disposed on the front surface are electrically connected using a wiring disposed on the sidewall of the light-emitting diode display panel, wherein the wiring disposed on the sidewall is electrically connected to the pixel structures and the driver chip by using side pads respectively disposed on the front and back sides of the base.

In the manufacturing process of the light-emitting diode display panel, after the wiring is formed on the sidewall, a testing step is needed to test whether the wiring may work normally. Generally speaking, a probe is brought into contact with the side pads to proceed. However, the probe readily damages the side pads, resulting in a decrease in the yield of the light-emitting diode display panel.

SUMMARY OF THE INVENTION

The invention provides a pixel array substrate with high yield.

A pixel array substrate of the invention includes a base, a plurality of pixel structures, a plurality of first bonding pads, a plurality of second bonding pads, a plurality of first wirings, a first testing element, and a second testing element. The base has a first surface, a second surface, and a first sidewall, wherein the first sidewall is disposed between the first surface and the second surface, and the first surface has an active area and a peripheral region outside the active area. The plurality of pixel structures are disposed on the active area of the first surface. The plurality of first bonding pads are disposed on a peripheral region of the first surface and electrically connected to the plurality of pixel structures. The plurality of second bonding pads are disposed on the second surface. Each of the first wirings is disposed on a corresponding first bonding pad, the first sidewall, and a corresponding second bonding pad, and electrically connected to the corresponding first bonding pad and the corresponding second bonding pad. The first testing element is disposed on the active area of the first surface and has a first testing line. The first testing line is electrically connected to at least one of the first bonding pads, and an end of the first testing line is substantially aligned with an edge of the base. The second testing element is disposed on the second surface. The second testing element has a plurality of second testing lines and a plurality of first testing pads, the plurality of second bonding pads are respectively electrically connected to the plurality of second testing lines, and the plurality of second testing lines are respectively electrically connected to the plurality of first testing pads.

In an embodiment of the invention, the pixel array substrate further includes a plurality of first chip pads and a first driver chip. The plurality of first chip pads are disposed on the second surface of the base and electrically connected to the plurality of second bonding pads. The first driver chip disposed on the plurality of first chip pads and electrically connected to the plurality of first chip pads, wherein the plurality of first testing pads are disposed outside an area occupied by the plurality of first chip pads and the first driver chip.

In an embodiment of the invention, the pixel array substrate further includes a plurality of first fan-out traces disposed on the second surface of the base and respectively electrically connected to the plurality of second bonding pads, wherein the plurality of first chip pads are respectively electrically connected to the plurality of first fan-out traces, and the plurality of first chip pads are located between the plurality of first testing pads and the plurality of first fan-out traces.

In an embodiment of the invention, the first surface and the first sidewall have a first boundary, the plurality of first wirings are disposed on the first boundary, and the edge of the base substantially aligned with the end of the first testing line is staggered with the first boundary.

In an embodiment of the invention, the base further has a second sidewall disposed opposite to the first sidewall and between the first surface and the second surface. The pixel array substrate further includes a plurality of third bonding pads, a plurality of fourth bonding pads, and a plurality of second wirings. The plurality of third bonding pads are disposed on the peripheral region of the first surface. The plurality of fourth bonding pads are disposed on the second surface. Each of the second wirings is disposed on a corresponding third bonding pad, the second sidewall, and a corresponding fourth bonding pad, and electrically connected to the corresponding third bonding pad and the corresponding fourth bonding pad, wherein the first testing line is electrically connected to a first bonding pad and a third bonding pad corresponding to each other.

In an embodiment of the invention, the first testing line has a first portion extended in a first direction and a second portion extended in a second direction. The first direction and the second direction are staggered. The first portion has an end aligned with an edge of the base, and the second portion is connected to the first bonding pad and the third bonding pad corresponding to each other.

In an embodiment of the invention, the second testing element further includes a plurality of third testing lines and a plurality of second testing pads. The plurality of fourth bonding pads are respectively electrically connected to the plurality of third testing lines. The plurality of third testing lines are respectively electrically connected to the plurality of second testing pads.

In an embodiment of the invention, the second testing element further includes a plurality of third testing lines, wherein the plurality of fourth bonding pads are respectively electrically connected to the plurality of third testing lines, the plurality of third testing lines are respectively electrically connected to the plurality of first testing pads, and the plurality of second testing lines and the plurality of third testing lines are respectively located on opposite sides of the plurality of first testing pads.

In an embodiment of the invention, the first testing element further includes a testing shunt element and a plurality of wires. The first testing line is electrically connected to the testing shunt element. The testing shunt element is electrically connected to the plurality of wires, and the plurality of wires are respectively electrically connected to the plurality of first bonding pads.

In an embodiment of the invention, the first testing element further includes a plurality of wires disposed between the first testing line and the plurality of first bonding pads, wherein each of the wires has a disconnection from the first testing line.

Another pixel array substrate of the invention includes a base, a plurality of pixel structures, a plurality of first bonding pads, a plurality of second bonding pads, a plurality of first wirings, a plurality of third bonding pads, a plurality of fourth bonding pads, a plurality of second wirings, a first testing element, a second testing element, a plurality of first chip pads, and a first driver chip. The base has a first surface, a second surface, a first sidewall, and a second sidewall, wherein the first sidewall is disposed between the first surface and the second surface, the second sidewall is disposed opposite to the first sidewall and between the first surface and the second surface, and the first surface has an active area and a peripheral region outside the active area. The plurality of pixel structures are disposed on the active area of the first surface. The plurality of first bonding pads are electrically connected to the plurality of pixel structures and disposed on the peripheral region of the first surface. The plurality of second bonding pads are disposed on the second surface. Each of the first wirings is disposed on a corresponding first bonding pad, the first sidewall, and a corresponding second bonding pad, and electrically connected to the corresponding first bonding pad and the corresponding second bonding pad. The plurality of third bonding pads are electrically connected to the plurality of pixel structures and disposed on the peripheral region of the first surface. The plurality of fourth bonding pads are disposed on the second surface. Each of the second wirings is disposed on a corresponding third bonding pad, the second sidewall, and a corresponding fourth bonding pad, and electrically connected to the corresponding third bonding pad and the corresponding fourth bonding pad. The first testing element is disposed on the active area of the first surface and has a first testing line, wherein the first testing line is electrically connected to a corresponding first bonding pad and a corresponding third bonding pad. The second testing element is disposed on the second surface, wherein the second testing element has a plurality of second testing lines, a plurality of first testing pads, a plurality of third testing lines, and a plurality of second testing pads, the plurality of second bonding pads are respectively electrically connected to the plurality of second testing pads, the plurality of second testing lines are respectively electrically connected to the plurality of first testing pads, the plurality of fourth bonding pads are respectively electrically connected to the plurality of third testing lines, and the plurality of third testing lines are respectively electrically connected to the plurality of second testing pads. The plurality of first chip pads are disposed on the second surface of the base and respectively electrically connected to the plurality of second bonding pads. The first driver chip is disposed on the plurality of first chip pads and electrically connected to the plurality of first chip pads. The plurality of first testing pads and the plurality of second testing pads are disposed outside an area occupied by the plurality of first chip pads and the first driver chip.

In an embodiment of the invention, the pixel array substrate further includes a plurality of first fan-out traces disposed on the second surface of the base, wherein the plurality of second bonding pads are respectively electrically connected to the plurality of first fan-out traces, the plurality of first fan-out traces are respectively electrically connected to the plurality of first chip pads, and the plurality of first chip pads are located between the plurality of first fan-out traces and the plurality of first testing pads.

In an embodiment of the invention, the pixel array substrate further includes a plurality of second chip pads and a second driver chip. The plurality of second chip pads are disposed on the second surface of the base and respectively electrically connected to the plurality of fourth bonding pads. The second driver chip is disposed on the plurality of second chip pads and electrically connected to the plurality of second chip pads.

The plurality of first testing pads and the plurality of second testing pads are disposed outside an area occupied by the plurality of second chip pads and the second driver chip.

In an embodiment of the invention, the pixel array substrate further includes a plurality of first fan-out traces and a plurality of second fan-out traces. The plurality of first fan-out traces are disposed on the second surface of the base, wherein the plurality of second bonding pads are respectively electrically connected to the plurality of first fan-out traces, the plurality of first fan-out traces are respectively electrically connected to the plurality of first chip pads, and the plurality of first chip pads are located between the plurality of first fan-out traces and the plurality of first testing pads. The plurality of second fan-out traces are disposed on the second surface of the base, wherein the plurality of fourth bonding pads are respectively electrically connected to the plurality of second fan-out traces, the plurality of second fan-out traces are respectively electrically connected to the plurality of second chip pads, and the plurality of second chip pads are located between the plurality of second fan-out traces and the plurality of second testing pads.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A is a diagram of a pixel array substrate 10 of an embodiment of the invention.

FIG. 1B is a diagram of the pixel array substrate 10 of an embodiment of the invention.

FIG. 8A is a diagram of a pixel array substrate 10E of an embodiment of the invention.

FIG. 8B is a diagram of the pixel array substrate 10E of an embodiment of the invention.

DESCRIPTION OF THE EMBODIMENTS

Figure 2:
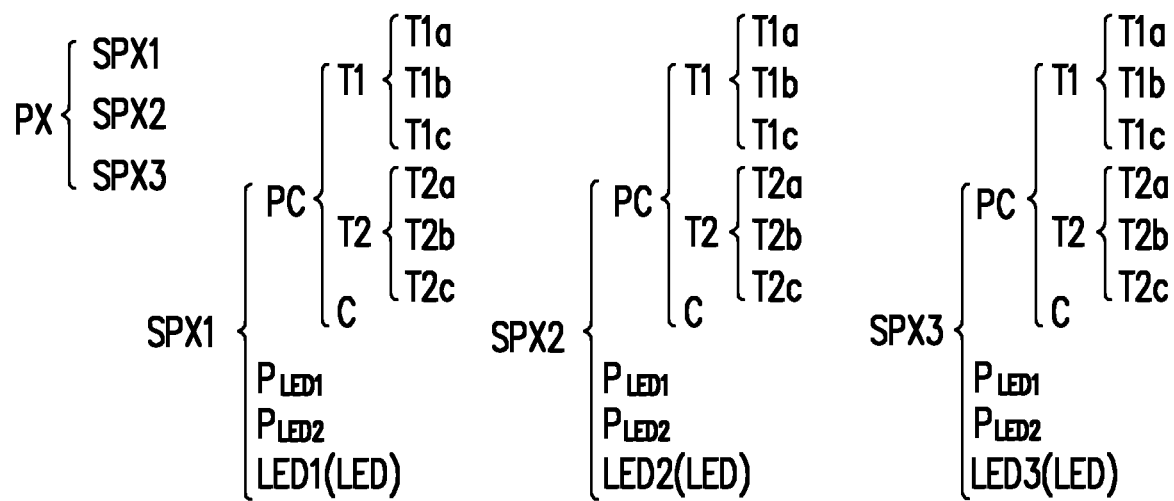
FIG. 2 is a diagram of a pixel structure PX of an embodiment of the invention.
Figure 2:
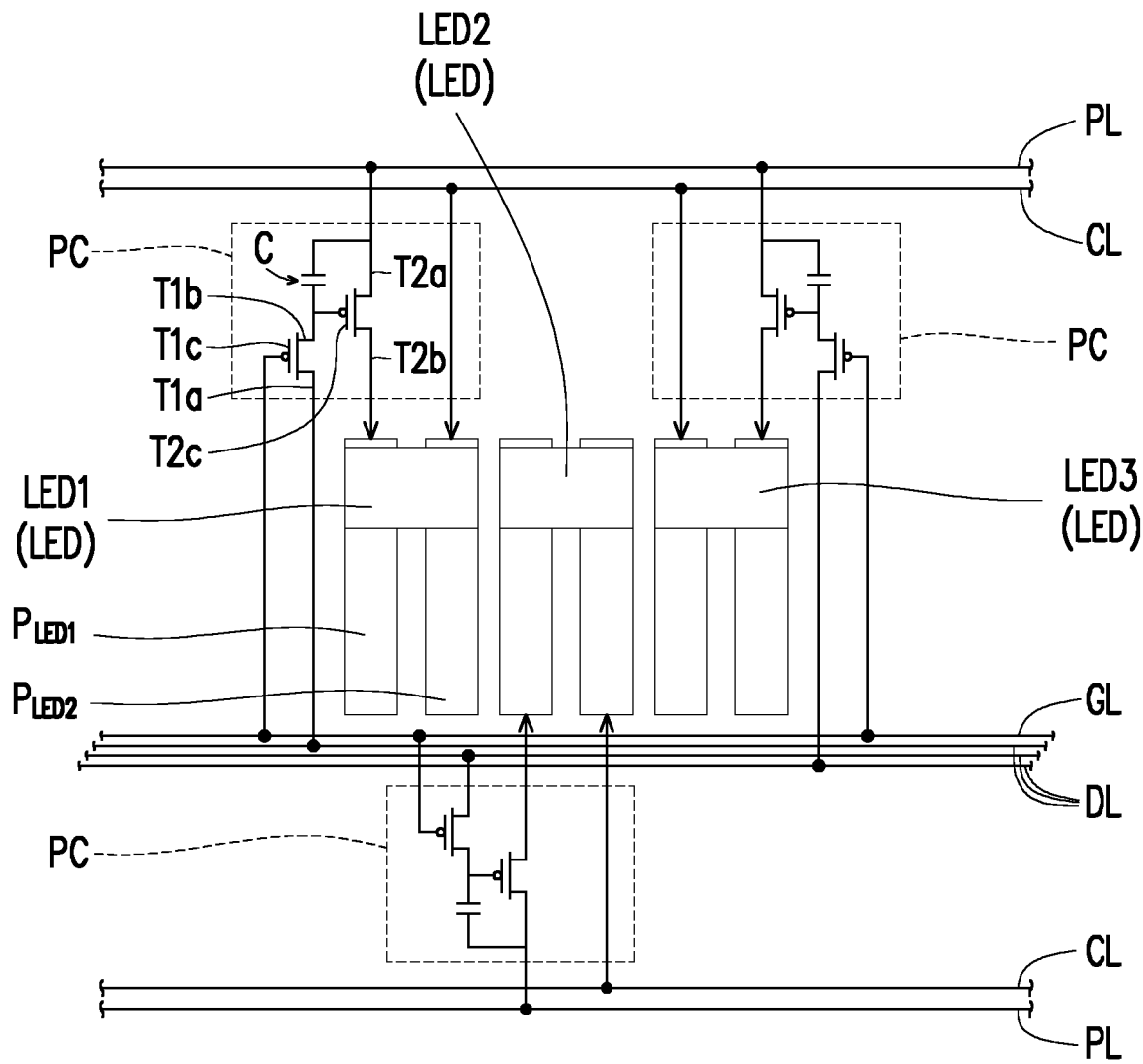

Hereinafter, exemplary embodiments of the invention are described in detail, and examples of the exemplary embodiments are conveyed via the figures. Wherever possible, the same reference numerals are used in the figures and the descriptions to refer to the same or similar portions.

It should be understood that, when a layer, film, region, or an element of a substrate is "on" another element or "connected to" another element, the element may be directly on the other element or connected to the other element, or an intermediate element may also be present. On the other hand, when an element is "directly on another element" or "directly connected to" another element, an intermediate element is not present. As used in the present specification, "connected to" may refer to a physical and/or electrical connection. Furthermore, "electrically connected" or "coupled" may mean that other elements are present between two elements.

"About", "similar", or "substantially" used in the present specification include the value and the average value within an acceptable deviation range of a specific value confirmed by those having ordinary skill in the art, and the concerned measurement and a specific quantity (i.e., limitations of the measuring system) of measurement-related errors are taken into consideration. For instance, "about" may represent within one or a plurality of standard deviations of the value, or within ±30%, ±20%, ±10%, or ±5%. Moreover, "about", "similar", or "substantially" used in the present specification may include a more acceptable deviation range or standard deviation according to optical properties, etching properties, or other properties, and one standard deviation does not need to apply to all of the properties.

Unless otherwise stated, all of the terminology used in the present specification (including technical and scientific terminology) have the same definition as those commonly understood by those skilled in the art of the invention. It should be further understood that, terminology defined in commonly-used dictionaries should be interpreted to have the same definitions in related art and in the entire specification of the invention, and are not interpreted as ideal or overly-formal definitions unless clearly stated as such in the present specification.

FIG. 1A is a diagram of a pixel array substrate 10 of an embodiment of the invention. In particular, FIG. 1A shows a first surface 112 of a base 110 of the pixel array substrate 10 and the components thereon.

FIG. 1B is a diagram of the pixel array substrate 10 of an embodiment of the invention. In particular, FIG. 1B shows a second surface 114 of the base 110 of the pixel array substrate 10 and the components thereon.

Referring to FIG. 1A and FIG. 1B, the pixel array substrate 10 includes the base 110. The base 110 has the first surface 112, the second surface 114, a first sidewall 116, and a second sidewall 118. The first surface 112 has an active area 112a and a peripheral region 112b outside the active area 112a. The first surface 112 is the front surface. The second surface 114 is the back surface. The first sidewall 116 is disposed between the first surface 112 and the second surface 114. The second sidewall 118 is disposed opposite to the first sidewall 116 and between the first surface 112 and the second surface 114. In the present embodiment, the material of the substrate 110 may be glass, quartz, organic polymers, opaque/reflective materials (for example, wafers, ceramics, etc.), or other applicable materials.

FIG. 2 is a diagram of a pixel structure PX of an embodiment of the invention. Please refer to FIG. 1A and FIG. 2, the pixel array substrate 10 further includes a plurality of pixel structures PX disposed on the active area 112a of the first surface 112.

Please refer to FIG. 2, for example, in the present embodiment, one pixel structure PX includes a plurality of sub-pixel structures SPX1, SPX2, and SPX3, each of the sub-pixel structure SPX1, SPX2, and SPX3 includes a pixel driving circuit PC, a first light-emitting diode pad $P_{LED1}$, a second light-emitting diode pad $P_{LED2}$ and a light-emitting diode element LED, and a plurality of light-emitting diode elements LED1, LED2, and LED3 of the plurality of sub-pixel structures SPX1, SPX2, and SPX3 are used to respectively emit different colors. The pixel driving circuit PC of each of the sub-pixel structures SPX1, SPX2, and SPX3 includes a first transistor T1, a second transistor T2, and a capacitor C, wherein a first terminal T1a of the first transistor T1 is electrically connected to a corresponding data line DL, a control terminal T1c of the first transistor T1 is electrically connected to a corresponding scan line GL, a second terminal T1b of the first transistor T1 is electrically connected to a control terminal T2c of the second transistor T2, a first terminal T2a of the second transistor T2 is electrically connected to a corresponding power line PL, the capacitor C is electrically connected to the second terminal T1b of the first transistor T1 and the first terminal T2a of the second transistor T2, the first light-emitting diode pad $P_{LED1}$ is electrically connected to the second terminal T2b of the second transistor T2, the second light-emitting diode pad $P_{LED2}$ is electrically connected to a corresponding common line CL, the first electrode (not shown) of the light-emitting diode element LED is electrically connected to the first light-emitting diode pad $P_{LED1}$, and the second electrode (not shown) of the light-emitting diode element LED is electrically connected to the second light-emitting diode pad $P_{LED2}$. However, the invention is not limited thereto. In other embodiments, the pixel structures PX may also be of other types.

Referring to FIG. 1A, the pixel array substrate 10 further includes a plurality of first bonding pads $P_{SW1}$ disposed on the peripheral region 112b of the first surface 112 and electrically connected to the plurality of pixel structures PX. Referring to FIG. 1A and FIG. 2, for example, in the present embodiment, the plurality of first bonding pads $P_{SW1}$ may be electrically connected to a plurality of data lines DL, a plurality of scan lines GL, a plurality of power lines PL, and a plurality of common lines CL, or a combination thereof to be electrically connected to the plurality of pixel structures PX, but the invention is not limited thereto.

Based on the consideration of electrical conductivity, in the present embodiment, the first bonding pads $P_{SW1}$ adopt a metal material. However, the invention is not limited thereto. In other embodiments, the first bonding pads $P_{SW1}$ may also adopt other conductive materials such as an alloy, metal nitride, metal oxide, metal oxynitride, or stacked layers of a metal material and other conductive materials.

Referring to FIG. 1A and FIG. 1B, the pixel array substrate 10 further includes a plurality of second bonding pads $P_{SW2}$ disposed on the second surface 114. Based on the consideration of electrical conductivity, in the present embodiment, the second bonding pads $P_{SW2}$ adopt a metal material. However, the invention is not limited thereto. In other embodiments, the second bonding pads $P_{SW2}$ may also adopt other conductive materials such as an alloy, metal nitride, metal oxide, metal oxynitride, or stacked layers of a metal material and other conductive materials.

Referring to FIG. 1A and FIG. 1B, the pixel array substrate 10 further includes a plurality of first wirings $L_{SW1}$, wherein each of the first wirings $L_{SW1}$ is disposed at one corresponding first bonding pad $P_{SW1}$, the first sidewall 116, and one corresponding second bonding pad $P_{SW2}$, and electrically connected to the corresponding first bonding pad $P_{SW1}$ and the corresponding second bonding pad $P_{SW2}$. Based on the consideration of electrical conductivity, in the present embodiment, the first wirings $L_{SW1}$ adopt a metal material. However, the invention is not limited thereto. In other embodiments, the first wirings $L_{SW1}$ may also adopt other conductive materials such as an alloy, metal nitride, metal oxide, metal oxynitride, or stacked layers of a metal material and other conductive materials.

Please refer to FIG. 1A, the pixel array substrate 10 further includes a first testing element 130 disposed on the active area 112a of the first surface 112. The first testing element 130 has at least one first testing line $L_{t1}$. The at least one first testing line $L_{t1}$ is electrically connected to at least one first bonding pad $P_{SW1}$. For example, in the present embodiment, the first testing element 130 may have a plurality of first testing lines $L_{t1}$, and the plurality of first testing lines $L_{t1}$ are respectively electrically connected to the plurality of first bonding pads $P_{SW1}$; in the active area 112a, the plurality of first testing lines $L_{t1}$ are separated from each other.

Please refer to FIG. 1B, the pixel array substrate 10 further includes a second testing element 140 disposed on the second surface 114. The second testing element 140 has a plurality of second testing lines $L_{t2}$ and a plurality of first testing pads $P_{t1}$. The plurality of second bonding pads $P_{SW2}$ are respectively electrically connected to the plurality of second testing lines $L_{t2}$, and the plurality of second testing lines $L_{t2}$ are respectively electrically connected to the plurality of first testing pads $P_{t1}$.

In the present embodiment, the pixel array substrate 10 further includes a plurality of first chip pads $P_{IC1}$, a plurality of first fan-out traces $L_{F1}$, and a first driver chip IC1 disposed on the second surface 114. The plurality of first fan-out traces $L_{F1}$ are respectively electrically connected to the plurality of second bonding pads $P_{SW2}$. The plurality of first chip pads $P_{IC1}$ are respectively electrically connected to the plurality of first fan-out traces $L_{F1}$. The first driver chip IC1 is disposed on the plurality of first chip pads $P_{IC1}$ and electrically connected to the plurality of first chip pads $P_{IC1}$. Referring to FIG. 1A and FIG. 1B, the first driver chip IC1 is electrically connected to the plurality of pixel structures PX via the plurality of first chip pads $P_{IC1}$, the plurality of first fan-out traces $L_{F1}$, the plurality of second bonding pads $P_{SW2}$, the plurality of first wirings $L_{SW1}$, and the plurality of first bonding pads $P_{SW1}$ to drive them.

Referring to FIG. 1B, the plurality of first testing pads $P_{t1}$ are disposed outside an area occupied by the plurality of first chip pads $P_{IC1}$ and the first driver chip IC1. In other words, the first testing pads $P_{t1}$ are additional testing pads provided for testing the first wirings $L_{SW1}$. For example, in the present embodiment, the plurality of first chip pads $P_{IC1}$ may be disposed between the plurality of first testing pads $P_{t1}$ and the plurality of first fan-out traces $L_{F1}$, but the invention is not limited thereto.

Referring to FIG. 1A, during the manufacturing process of the pixel array substrate 10, a block K and the components thereon shown in dashed lines are removed and are not kept in the finished pixel array substrate 10. Please refer to FIG. 1A and FIG. 1B. Specifically, the block K and the base 110 are originally the same base material. In the manufacturing process of the pixel array substrate 10, the plurality of pixel structures PX, the plurality of first bonding pads $P_{SW1}$, the first testing element 130, and a testing pad $P_{t0}$ located on the block K are formed on the front surface of the base material, wherein the first testing line $L_{t1}$ of the first testing element 130 passes through a predetermined cutting path C1 and is electrically connected to the testing pad $P_{t0}$; in addition, the plurality of second bonding pads $P_{SW2}$, the second testing element 140, the plurality of first chip pads $P_{IC1}$, and the plurality of first fan-out traces $L_{F1}$ are also formed on the back surface of the base material; then, the plurality of first wirings $L_{SW1}$ are formed on the sidewall of the base material.

After the plurality of first wirings $L_{SW1}$ are formed, a testing step is performed to test whether the plurality of first wirings $L_{SW1}$ may be operated normally. For example, in the present embodiment, a signal may be input to the testing pad $P_{t0}$ located on the block K, and a plurality of signals of the plurality of first testing pads $P_{t1}$ may be received. According to the plurality of signals of the plurality of first testing pads $P_{t1}$, whether the plurality of first wirings $L_{SW1}$ respectively corresponding to the plurality of first testing pads $P_{t1}$ may be operated normally may be determined.

Please refer to FIG. 1A. After the above testing step is completed, a cutting process is performed along the predetermined cutting path C1 to remove the block K. When the block K is removed, the first testing line $L_{t1}$ passing through the cutting path C1 is also removed. Therefore, in the finished pixel array substrate 10, an end E of the first testing line $L_{t1}$ is substantially aligned with an edge 110e of the base 110.

In the present embodiment, the first surface 112 and the first sidewall 116 have a first boundary B1, the plurality of first wirings $L_{SW1}$ are disposed on the first boundary B1, and the edge 110e of the base 110 substantially aligned with the end E of the first testing line $L_{t1}$ is staggered with the first boundary B1.

It is worth mentioning that in the above testing step, the probe is in contact with the testing pad $P_{t0}$ and the first testing pads $P_{t1}$, instead of in contact with the first bonding pads $P_{SW1}$ and the second bonding pads $P_{SW2}$ used to overlap the first wirings $L_{SW1}$. Therefore, the first bonding pads $P_{SW1}$ and the second bonding pads $P_{SW2}$ are not damaged by the probe and do not affect the yield of the pixel array substrate 10. In addition, the first testing pads $P_{t1}$ are disposed on the second surface 114 (i.e., the back surface) of the base 110, and the testing pad $P_{t0}$ is removed after the above testing step is completed. Therefore, the first testing pads $P_{t1}$ and the testing pad $P_{t0}$ do not occupy the peripheral region 112b of the first surface 112, thus facilitating an ultra-narrow or even borderless pixel array substrate 10.

It should be mentioned here that, the following embodiments adopt the reference numerals of the embodiments above and a portion of the content thereof, wherein the same reference numerals are used to represent the same or similar devices and descriptions of the same technical content are omitted. The omitted portions are as described in the embodiments above and are not repeated in the embodiments below.

Figure 3A:
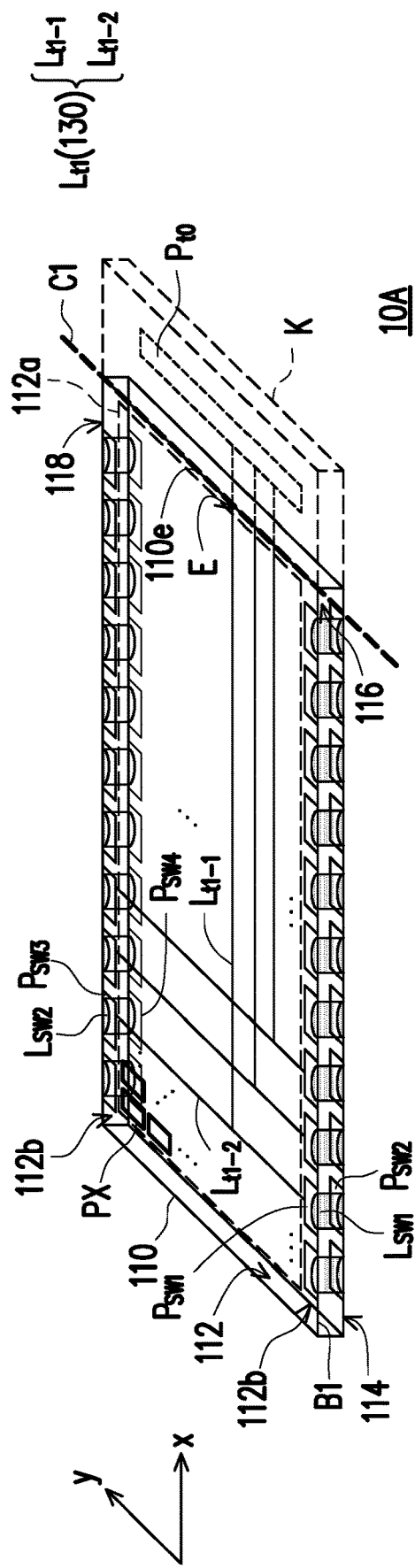
FIG. 3A is a diagram of a pixel array substrate 10A of an embodiment of the invention.

FIG. 3A is a diagram of a pixel array substrate 10A of an embodiment of the invention. In particular, FIG. 3A shows the first surface 112 of the base 110 of the pixel array substrate 10A and the components thereon.

Figure 3B:
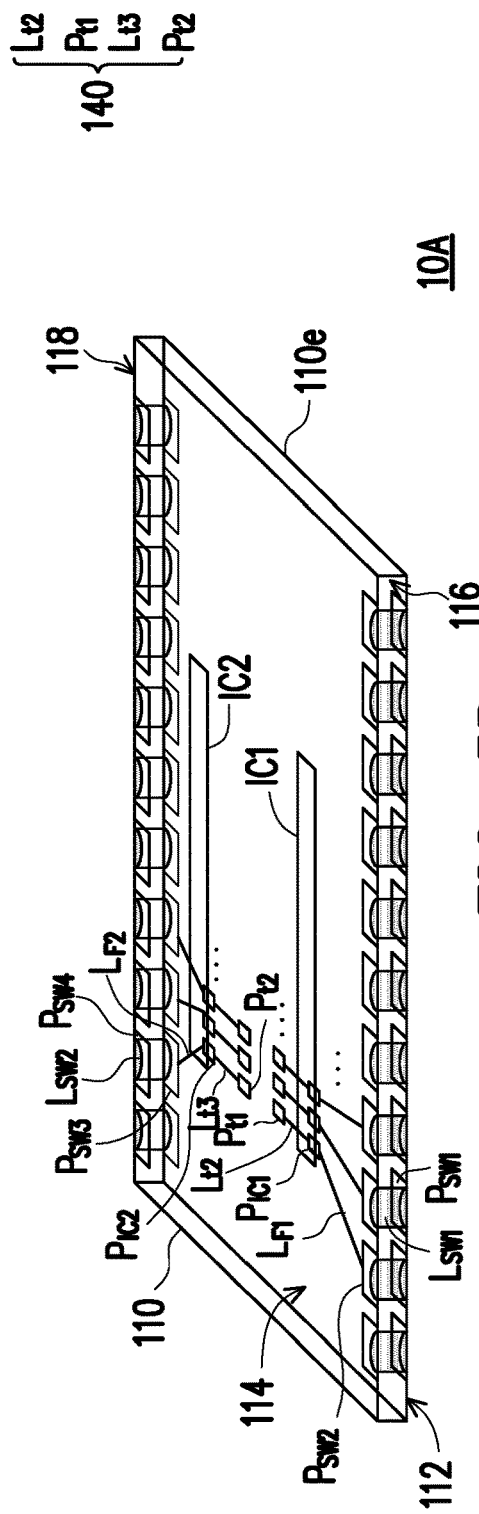
FIG. 3B is a diagram of the pixel array substrate 10A of an embodiment of the invention.

FIG. 3B is a diagram of the pixel array substrate 10A of an embodiment of the invention. In particular, FIG. 3B shows the second surface 114 of the base 110 of the pixel array substrate 10A and the components thereon.

The pixel array substrate 10A of the present embodiment is similar to the pixel array substrate 10, and the differences between the two are explained as follows.

Referring to FIG. 3A and FIG. 3B, the pixel array substrate 10A includes a plurality of third bonding pads $P_{SW3}$, a plurality of fourth bonding pads $P_{SW4}$, and a plurality of second wirings $L_{SW2}$. The plurality of third bonding pads $P_{SW3}$ are disposed on the peripheral region 112b of the first surface 112. The plurality of fourth bonding pads $P_{SW4}$ are disposed on the second surface 114. Each of the second wirings $L_{SW2}$ is disposed on a corresponding third bonding pad $P_{SW3}$, the second sidewall 118, and a corresponding fourth bonding pad $P_{SW4}$, and electrically connected to the corresponding third bonding pad $P_{SW3}$ and the corresponding fourth bonding pad $P_{SW4}$.

Referring to FIG. 3A, in the present embodiment, the first testing line $L_{t1}$ is electrically connected to a first bonding pad $P_{SW1}$ and a third bonding pad $P_{SW3}$ corresponding to each other. Specifically, the first testing line $L_{t1}$ has a first portion $L_{t1\text{-}1}$ extended in a first direction x and a second portion $L_{t1\text{-}2}$ extended in a second direction y, the first direction x and the second direction y are staggered, the first portion $L_{t1\text{-}1}$ has the end E aligned with the edge 110e of the base 110, and the second portion $L_{t1\text{-}2}$ is connected to the first bonding pad $P_{SW1}$ and the third bonding pad $P_{SW3}$ corresponding to each other.

Referring to FIG. 3B, the second testing element 140 further includes a plurality of third testing lines $L_{t3}$ and a plurality of second testing pads $P_{t2}$. The plurality of fourth bonding pads $P_{SW4}$ are respectively electrically connected to the plurality of third testing lines $L_{t3}$. The plurality of third testing lines $L_{t3}$ are respectively electrically connected to the plurality of second testing pads $P_{t2}$.

In the present embodiment, the pixel array substrate 10A further includes a plurality of second chip pads $P_{IC2}$, a plurality of second fan-out traces $L_{F2}$, and a second driver chip IC2 disposed on the second surface 114. The plurality of second fan-out traces $L_{F2}$ are respectively electrically connected to the plurality of fourth bonding pads $P_{SW4}$. The plurality of second chip pads $P_{IC2}$ are respectively electrically connected to the plurality of second fan-out traces $L_{F2}$. The second driver chip IC2 is disposed on the plurality of second chip pads $P_{IC2}$ and electrically connected to the plurality of second chip pads $P_{IC2}$. Referring to FIG. 3A and FIG. 3B, the second driver chip IC2 is electrically connected to the plurality of pixel structures PX via the plurality of second chip pads $P_{IC2}$, the plurality of second fan-out traces $L_{F2}$, the plurality of fourth bonding pads $P_{SW4}$, the plurality of second wirings $L_{SW2}$, and the plurality of third bonding pads $P_{SW3}$ to drive them.

Referring to FIG. 3B, the plurality of second testing pads $P_{t2}$ are disposed outside an area occupied by the plurality of second chip pads $P_{IC2}$ and the second driver chip IC2. In other words, the second testing pads $P_{t2}$ are additional testing pads provided for testing the second wirings $L_{SW2}$. For example, in the present embodiment, the plurality of second chip pads $P_{IC2}$ may be disposed between the plurality of second testing pads $P_{t2}$ and the plurality of second fan-out traces $L_{F2}$, but the invention is not limited thereto.

Similar to the manufacturing process of the pixel array substrate 10, in the manufacturing process of the pixel array substrate 10A, after the plurality of first wirings $L_{SW1}$ and the plurality of second wirings $L_{SW2}$ are formed, a testing step is performed to test whether the plurality of first wirings $L_{SW1}$ and the plurality of second wirings $L_{SW2}$ may be operated normally. For example, in the present embodiment, a signal may be input to the testing pad $P_{t0}$ located on the block K, and a plurality of signals of the plurality of first testing pads $P_{t1}$ and a plurality of signals of the plurality of second testing pads $P_{t2}$ may be received. According to the plurality of signals of the plurality of first testing pads $P_{t1}$ and the plurality of signals of the plurality of second testing pads $P_{t2}$, whether the plurality of first wirings $L_{SW1}$ respectively corresponding to the plurality of first testing pads $P_{t1}$ and the plurality of second wirings $L_{SW2}$ corresponding to the plurality of second testing pads $P_{t2}$ may be operated normally may be determined.

Figure 4A:
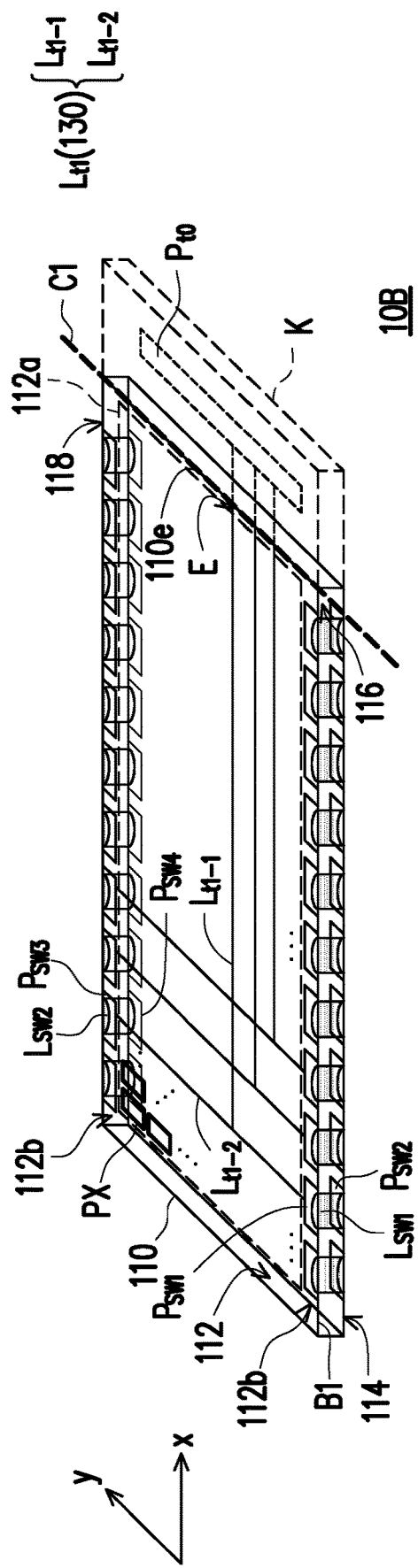
FIG. 4A is a diagram of a pixel array substrate 10B of an embodiment of the invention.

FIG. 4A is a diagram of a pixel array substrate 10B of an embodiment of the invention. In particular, FIG. 4A shows the first surface 112 of the base 110 of the pixel array substrate 10B and the components thereon.

Figure 4B:
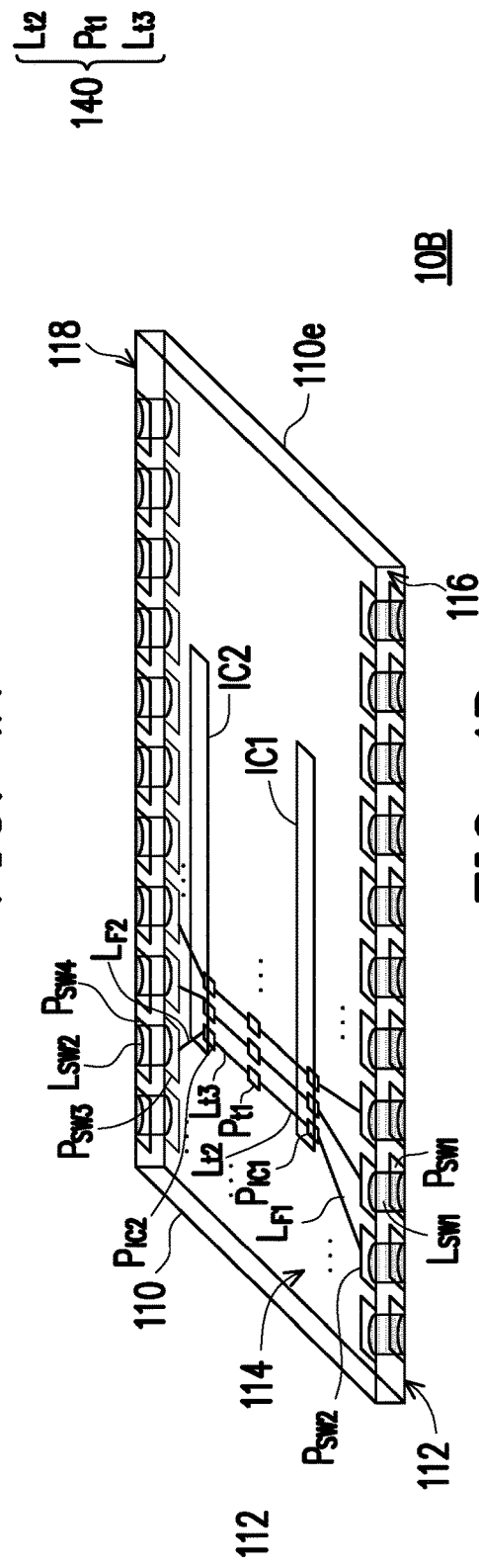
FIG. 4B is a diagram of the pixel array substrate 10B of an embodiment of the invention.

FIG. 4B is a diagram of the pixel array substrate 10B of an embodiment of the invention. In particular, FIG. 4B shows the second surface 114 of the base 110 of the pixel array substrate 10B and the components thereon.

The pixel array substrate 10B of the present embodiment is similar to the pixel array substrate 10A of FIG. 3A and FIG. 3B. The difference between the two is that the pixel array substrate 10B does not need to include the plurality of second testing pads $P_{t2}$ of the pixel array substrate 10A. In the pixel array substrate 10B, the plurality of third testing lines $L_{t3}$ are respectively electrically connected to the plurality of first testing pads $P_{t1}$, and the plurality of second testing lines $L_{t2}$ and the plurality of third testing lines $L_{t3}$ are respectively located on opposite sides of the plurality of first testing pads $P_{t1}$.

Similar to the manufacturing process of the pixel array substrate 10A, in the manufacturing process of the pixel array substrate 10B, after the plurality of first wirings $L_{SW1}$ and the plurality of second wirings $L_{SW2}$ are formed, a testing step is performed to test whether the plurality of first wirings $L_{SW1}$ and the plurality of second wirings $L_{SW2}$ may be operated normally. For example, in the present embodiment, a signal may be input to the testing pad $P_{t0}$ located on the block K, and a plurality of signals of the plurality of first testing pads $P_{t1}$ may be received. According to the signal of each of the first testing pads $P_{t1}$, whether a first wiring $L_{SW1}$ and a second wiring $L_{SW2}$ corresponding to each other may be operated normally may be determined. For example, if the signal of a first testing pad $P_{t1}$ is different from a normal value, it may be preliminarily determined that at least one of a first wiring $L_{SW1}$ and a second wiring $L_{SW2}$ corresponding to the first testing pad $P_{t1}$ is abnormal; then, an inspector may visually determine whether the first wiring $L_{SW1}$ is abnormal, the second wiring $L_{SW2}$ is abnormal, or both are abnormal.

Figure 5A:
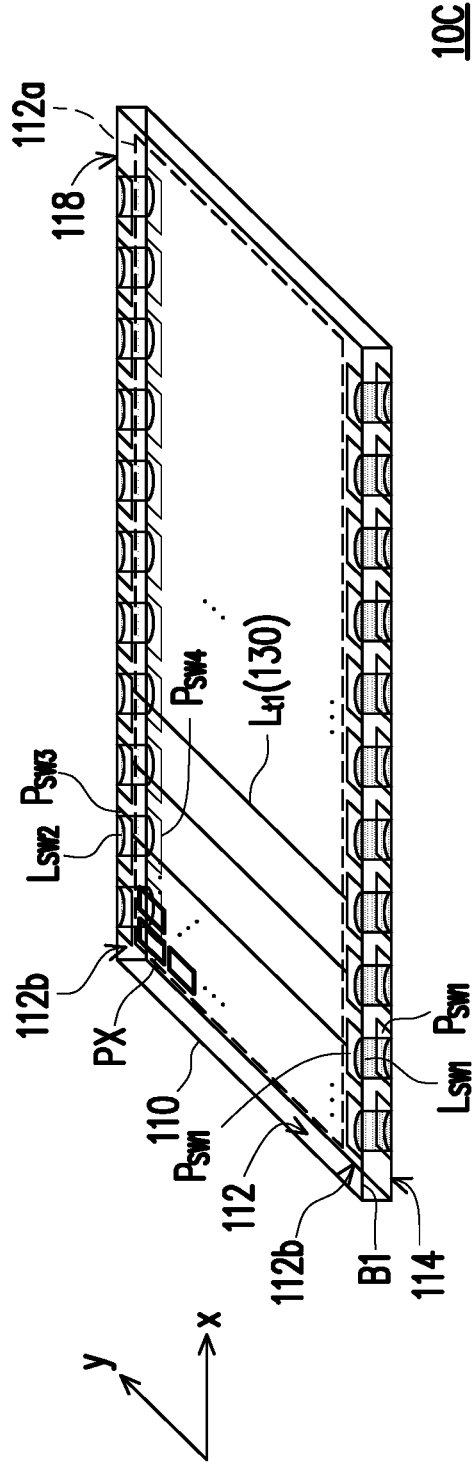
FIG. 5A is a diagram of a pixel array substrate 10C of an embodiment of the invention.

FIG. 5A is a diagram of a pixel array substrate 10C of an embodiment of the invention. In particular, FIG. 5A shows the first surface 112 of the base 110 of the pixel array substrate 10C and the components thereon.

Figure 5B:
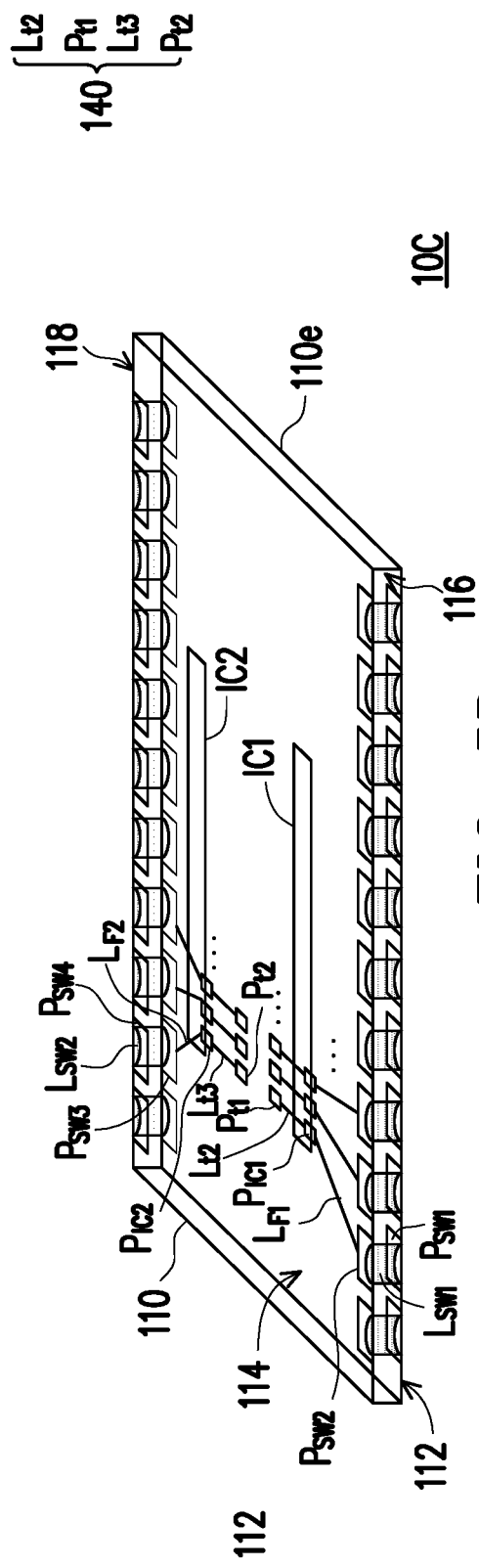
FIG. 5B is a diagram of the pixel array substrate 10C of an embodiment of the invention.

FIG. 5B is a diagram of the pixel array substrate 10C of an embodiment of the invention. In particular, FIG. 5B shows the second surface 114 of the base 110 of the pixel array substrate 10C and the components thereon.

Referring to FIG. 5A and FIG. 5B, the pixel array substrate 10C of the present embodiment is similar to the pixel array substrate 10A of FIG. 3A and FIG. 3B. The difference between the two is: in the embodiment of FIG. 5A and FIG. 5B, the first testing line $L_{t1}$ does not need to have the first portion Lug of the embodiment of FIG. 3A.

Similar to the manufacturing process of the pixel array substrate 10, in the manufacturing process of the pixel array substrate 10C, after the plurality of first wirings $L_{SW1}$ and the plurality of second wirings $L_{SW2}$ are formed, a testing step is performed to test whether the plurality of first wirings $L_{SW1}$ and the plurality of second wirings $L_{SW2}$ may be operated normally. For example, in the present embodiment, a signal may be input to the plurality of first testing pads $P_{t1}$, and a plurality of signals of the plurality of second testing pads $P_{t2}$ may be received. According to the signal of each of the second testing pads $P_{t2}$, whether a first wiring $L_{SW1}$ and a second wiring $L_{SW2}$ corresponding to each other may be operated normally may be determined. Specifically, if the signal of a second testing pad $P_{t2}$ is different from a normal value, it may be preliminarily determined that at least one of a first wiring $L_{SW1}$ and a second wiring $L_{SW2}$ corresponding to the second testing pad $P_{t2}$ is abnormal; then, an inspector may visually determine whether the first wiring $L_{SW1}$ is abnormal, the second wiring $L_{SW2}$ is abnormal, or both are abnormal.

Figure 6A:
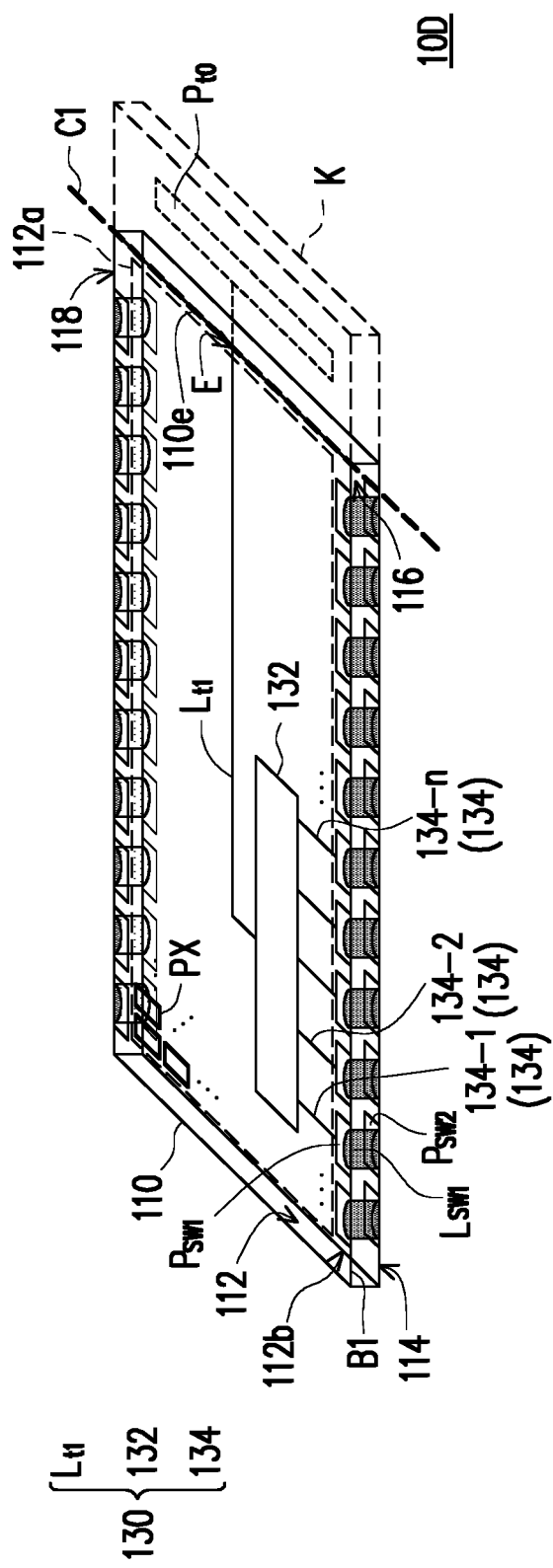
FIG. 6A is a diagram of a pixel array substrate 10D of an embodiment of the invention.

FIG. 6A is a diagram of a pixel array substrate 10D of an embodiment of the invention. In particular, FIG. 6A shows the first surface 112 of the base 110 of the pixel array substrate 10D and the components thereon.

Figure 6B:
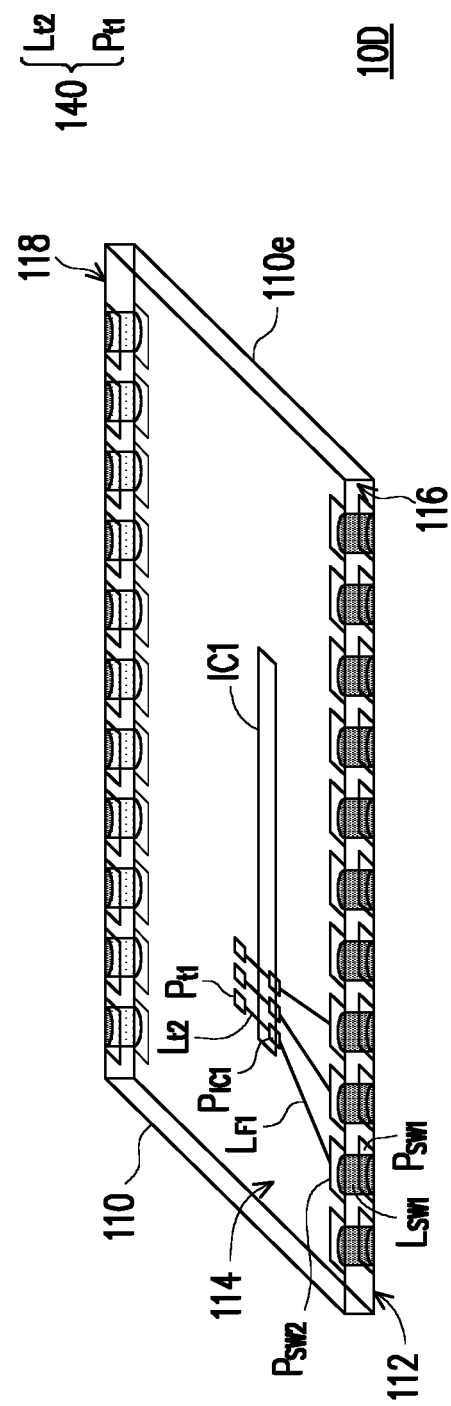
FIG. 6B is a diagram of the pixel array substrate 10D of an embodiment of the invention.

FIG. 6B is a diagram of the pixel array substrate 10D of an embodiment of the invention. In particular, FIG. 6B shows the second surface 114 of the base 110 of the pixel array substrate 10D and the components thereon.

The pixel array substrate 10D of the present embodiment is similar to the pixel array substrate 10 of FIG. 1A and FIG. 1B, and the difference between the two is: the first testing element 130 of the pixel array substrate 10D is different from the first testing element 130 of FIG. 1A and FIG. 1B.

Please refer to FIG. 6A. Specifically, in the present embodiment, the first testing element 130 includes the first testing line $L_{t1}$, a testing shunt element 132, and a plurality of wires 134. The end E of the first testing line $L_{t1}$ is substantially aligned with the edge 110e of the base 110. The first testing line $L_{t1}$ is electrically connected to the testing shunt element 132. The testing shunt element 132 is electrically connected to the plurality of wires 134, and the plurality of wires 134 are respectively electrically connected to the plurality of first bonding pads $P_{SW1}$.

Figure 7:
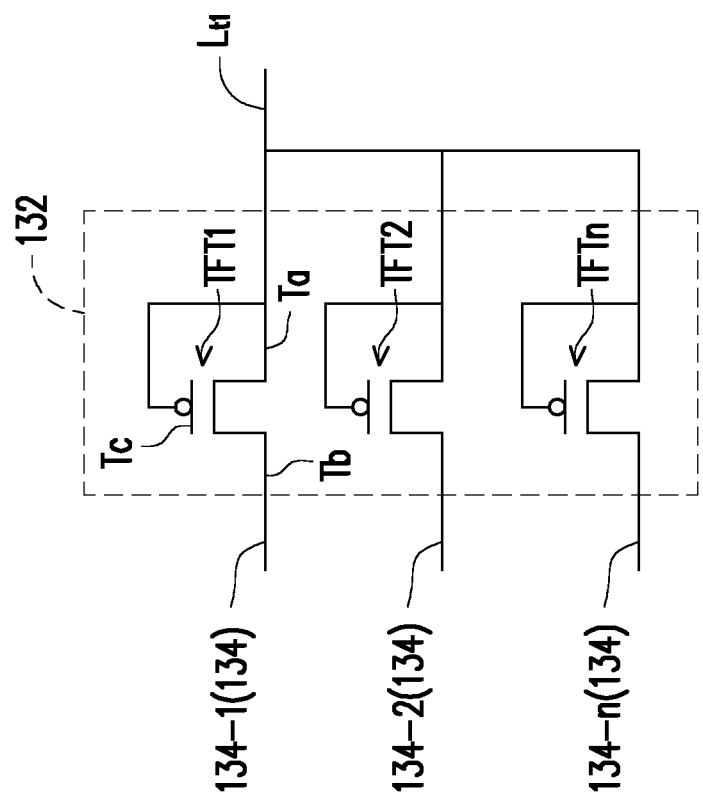
FIG. 7 shows a diagram of an equivalent circuit of a testing shunt element 132 of an embodiment of the invention.

FIG. 7 shows a diagram of an equivalent circuit of the testing shunt element 132 of an embodiment of the invention. Referring to FIG. 6A, FIG. 6B, and FIG. 7, in the manufacturing process of the pixel array substrate 10D, after the plurality of first wirings $L_{SW1}$ are formed, a testing step is performed to test whether the plurality of first wirings $L_{SW1}$ may be operated normally. In the testing step, the signal from the testing pad $P_{t0}$ may be input to the plurality of wires 134 in time sequence using the testing shunt element 132, or a plurality of signals from the plurality of first testing pads $P_{t1}$ may be input to the testing pad $P_{t0}$ in time sequence.

Referring to FIG. 7, for example, in the present embodiment, the testing shunt element 132 includes a plurality of transistors TFT1, TFT2 ... TFTn, and each of the transistors TFT1, TFT2 ... TFTn has a first terminal Ta, a second terminal Tb, and a control terminal Tc. The first terminal Ta of each of the transistors TFT1, TFT2 ... TFTn is electrically connected to the control terminal Tc, and the plurality of first terminals Ta of the plurality of transistors TFT1, TFT2 ... TFTn are electrically connected to the first testing line $L_{t1}$, and the plurality of second terminals Tb of the plurality of transistors TFT1, TFT2 ... TFTn are respectively electrically connected to a plurality of wires 134-1, 134-2 ... 134-n.

In the first time interval, the first testing line $L_{t1}$ may have a high potential, the wire 134-1 may have a low potential, and the remaining wires 134-2 ... 134-n may have a high potential. At this time, the signal may be transmitted to the wire 134-1 but not to the remaining wires 134-2 ... 134-n. In this way, a first wiring $L_{SW1}$ corresponding to the wire 134-1 may be tested in the first time interval. In the second time interval following the first time interval, the first testing line $L_{t1}$ may have a high potential, the wire 134-2 may have a low potential, and the remaining wires 134-1 ... 134-n may have a high potential. At this time, the signal may be transmitted to the wire 134-2 but not to the remaining wires 134-1 ... 134-n. In this way, a first wiring $L_{SW1}$ corresponding to the wire 134-2 may be tested in the second time interval. By analogy, the testing of the plurality of first wirings $L_{SW1}$ corresponding to the plurality of wires 134-1, 134-2 ... 134-n may be completed according to time sequence.

In the present embodiment, the plurality of transistors TFT1, TFT2 ... TFTn of the testing shunt element 132 may be optionally n-type transistors, and the driving method of the testing shunt element 132 is also exemplified under the premise that the plurality of transistors TFT1, TFT2 ... TFTn thereof are n-type transistors. However, the invention is not limited thereto. In another embodiment, the plurality of transistors TFT1, TFT2 ... TFTn of the testing shunt element 132 may also be p-type transistors, and the driving method of the testing shunt element 132 including a plurality of p-type transistors TFT1, TFT2 ... TFTn is similar to the driving method of the testing shunt element 132 including the plurality of n-type transistors TFT1, TFT2 ... TFTn. Specifically, by changing the high potential in the driving method of the testing shunt element 132 including the n-type transistors TFT1, TFT2 ... TFTn to a low potential and changing the low potential to a high potential, the testing shunt element 132 including a plurality of p-type transistors TFT1, TFT2 . . . TFTn may be driven.

It is worth mentioning that the arrangement of the testing shunt element 132 may reduce the area occupied by the first testing element 130 in the active area 112a, thus reducing the influence of the arrangement of the first testing element 130 on the resolution of the pixel array substrate 10D.

FIG. 8A is a diagram of a pixel array substrate 10E of an embodiment of the invention. In particular, FIG. 8A shows the first surface 112 of the base 110 of the pixel array substrate 10E and the components thereon.

FIG. 8B is a diagram of the pixel array substrate 10E of an embodiment of the invention. In particular, FIG. 8B shows the second surface 114 of the base 110 of the pixel array substrate 10E and the components thereon.

The pixel array substrate 10E of the present embodiment is similar to the pixel array substrate 10D of FIG. 6A and FIG. 6B. The difference between the two is: a testing shunt element 132' of the pixel array substrate 10E is different from the testing shunt element 132 of FIG. 6A.

Figure 9:
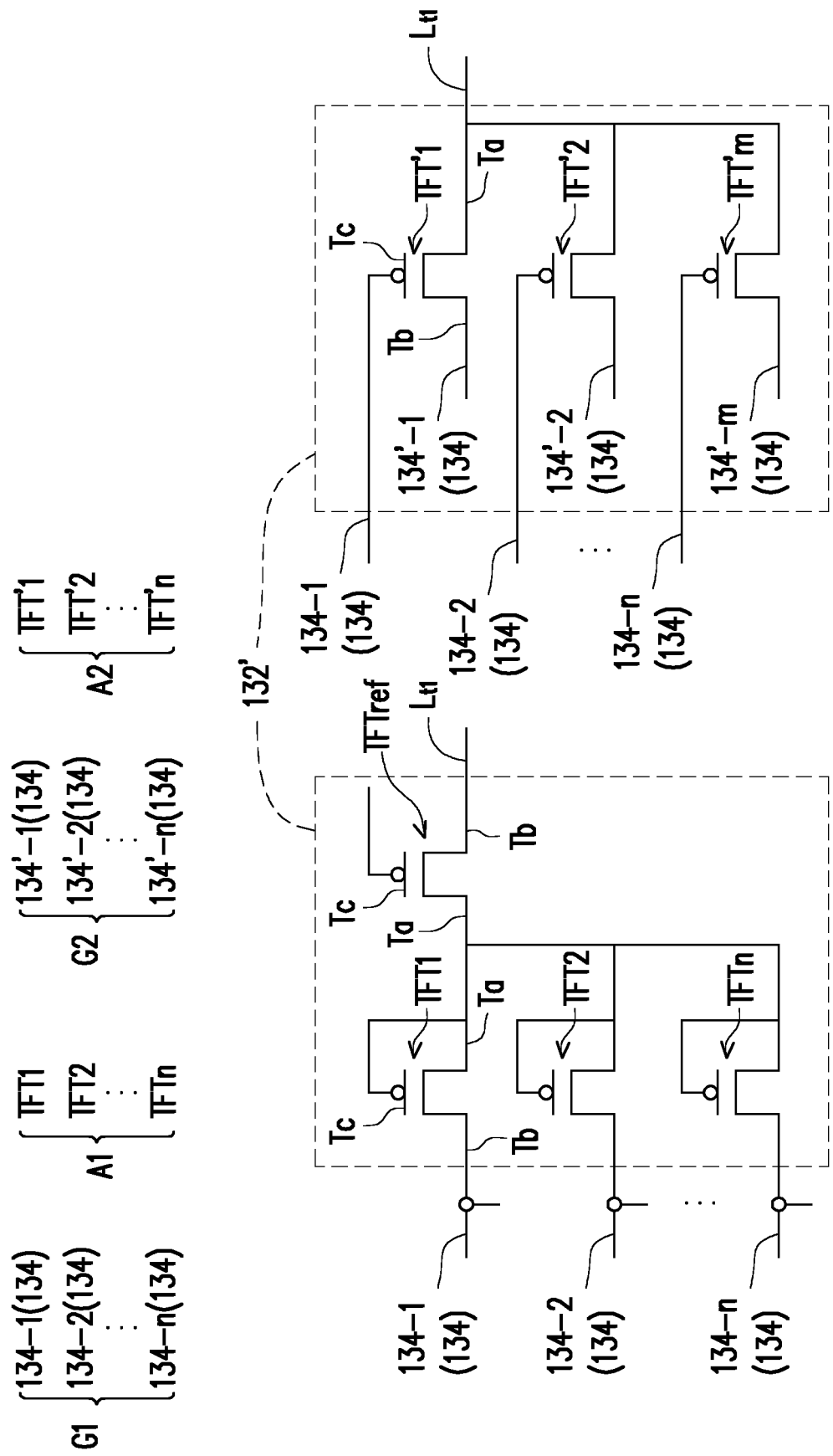
FIG. 9 shows a diagram of an equivalent circuit of a testing shunt element 132' of an embodiment of the invention.

FIG. 9 shows a diagram of an equivalent circuit of the testing shunt element 132' of an embodiment of the invention. Referring to FIG. 8A and FIG. 9, the plurality of wires 134 of the pixel array substrate 10E may be divided into a plurality of wire groups G1 and G2. The wire group G1 includes the plurality of wires 134-1, 134-2 . . . 134-n, and the wire group G2 includes a plurality of wires 134'-1, 134'-2 . . . 134'-m. The testing shunt element 132' includes a plurality of transistor groups A1 and A2. The transistor group A1 includes the plurality of transistors TFT1, TFT2 . . . TFTn, and the transistor group A2 includes a plurality of transistors TFT'1, TFT'2 . . . TFT'm. Each of the transistors TFT1, TFT2 . . . TFTn, TFT'1, TFT'2 . . . TFT'm has the first terminal Ta, the second terminal Tb, and the control terminal Tc. The first terminal Ta of each of the transistors TFT1, TFT2 . . . TFTn of the transistor group A1 is electrically connected to the control terminal Tc. The first terminals Ta of the plurality of TFT1, TFT2 . . . TFTn of the transistor group A1 are electrically connected to the first terminal Ta of a transistor TFTref. The second terminals Tb of the plurality of transistors TFT1, TFT2 . . . TFTn of the transistor group A1 are respectively electrically connected to the plurality of wires 134-1, 134-2 . . . 134-n of the wire group G1. The plurality of first terminals Ta of the plurality of transistors TFT'1, TFT'2 . . . TFT'm of the transistor group A2 are electrically connected to the second terminal Tb of the transistor TFTref. The control terminals Tc of the plurality of transistors TFT'1, TFT'2 . . . TFT'm of the transistor group A2 are respectively electrically connected to the second terminals Tb of the plurality of transistors TFT1, TFT2 . . . TFTn of the transistor group A1. The second terminals Tb of the plurality of transistors TFT'1, TFT'2 . . . TFT'm of the transistor group A2 are respectively electrically connected to the plurality of wires 134'-1, 134'-2 . . . 134'-m of the wire group G2.

In the first time interval, the control terminal Tc of the transistor TFTref may have a low potential, and the first terminal Ta of the transistor TFTref may have a high potential, so that the signal may be transmitted to the transistor group A1, but not to the transistor group A2. In the first sub-interval of the first time interval, the wire 134-1 of the wire group G1 may have a low potential, and the remaining wires 134-2 . . . 134-n of the wire group G1 may have a high potential; at this time, the signal may be transmitted to the wire 134-1 of the wire group G1 but not to the remaining wires 134-2 . . . 134-n of the wire group G1. In this way, a first wiring $L_{SW1}$ corresponding to the wire 134-1 may be tested in the first sub-interval of the first time interval. In the second sub-interval of the first time interval following the first sub-interval, the wire 134-2 of the wire group G1 may have a low potential, and the remaining wires 134-1 . . . 134-n of the wire group G1 may have a high potential. At this time, the signal may be transmitted to the wire 134-2 of the wire group G1 but not to the remaining wires 134-1 . . . 134-n of the wire group G1. In this way, a first wiring $L_{SW1}$ corresponding to the wire 134-2 may be tested in the second sub-interval of the first time interval. By analogy, the testing of the plurality of first wirings $L_{SW1}$ corresponding to the plurality of wires 134-1, 134-2 . . . 134-n of the wire group G1 may be completed in the first time interval according to time sequence.

In the second time interval following the first time interval, the control terminal Tc of the transistor TFTref may have a high potential, and the second terminal Tb of the transistor TFTref may have a low potential, so that the signal from the first testing line $L_{t1}$ may be transmitted to the transistor group A2, but not to the transistor group A1. In the first sub-interval of the second time interval, the wires 134'-1, 134'-2 . . . 134'-m of the wire group G2 may have a high potential, the control terminal Tc of the transistor TFT'1 of the transistor group A2 may have a gate-on potential, and the control terminals Tc of the remaining transistors TFT'2 . . . TFT'm of the transistor group A2 may have a gate-off potential; at this time, the signal may be transmitted to the wire 134'-1 of the wire group G2 but not to the remaining wires 134'-2 . . . 134'-m of the wire group G2. In this way, a first wiring $L_{SW1}$ corresponding to the wire 134'-1 may be tested in the first sub-interval of the second time interval. In the second sub-interval of the second time interval following the first sub-interval, the wires 134'-1, 134'-2 . . . 134'-m of the wire group G2 may have a high potential, the control terminal Tc of the transistor TFT'2 of the transistor group A2 may have a gate-on potential, and the control terminals Tc of the remaining transistors TFT'1 . . . TFT'm of the transistor group A2 may have a gate-off potential; at this time, the signal may be transmitted to the wire 134'-2 of the wire group G2 but not to the remaining wires 134'-1 . . . 134'-m of the wire group G2. In this way, a first wiring $L_{SW1}$ corresponding to the wire 134'-2 may be tested in the second sub-interval of the second time interval. By analogy, the testing of the plurality of first wirings $L_{SW1}$ corresponding to the plurality of wires 134'-1, 134'-2 . . . 134'-m of the wire group G2 may be completed in the second time interval according to time sequence.

In the present embodiment, the plurality of transistors TFT1, TFT2 . . . TFTn, TFT'2 . . . TFT'm, TFTref of the testing shunt element 132' may be optionally n-type transistors, and the driving method of the testing shunt element 132' is also exemplified under the premise that the plurality of transistors TFT1, TFT2 . . . TFTn, TFT'2 . . . TFT'm, TFTref thereof are n-type transistors. However, the invention is not limited thereto. In another embodiment, the plurality of transistors TFT1, TFT2 . . . TFTn, TFT'2 . . . TFT'm, TFTref of the testing shunt element 132' may also be p-type transistors, and the driving method of the testing shunt element 132' including a plurality of p-type transistors TFT1, TFT2 . . . TFTn, TFT'2 . . . TFT'm, TFTref is similar to the driving method of the testing shunt element 132' including the plurality of n-type transistors TFT1, TFT2 . . . TFTn, TFT'2 . . . TFT'm. Specifically, by changing the high potential in the driving method of the testing shunt element 132 including the n-type transistors TFT1, TFT2 . . . TFTn, TFT'2 . . . TFT'm, TFTref to a low potential and changing the low potential to a high potential, the testing shunt element 132' including a plurality of p-type transistors TFT1, TFT2 . . . TFTn, TFT'2 . . . TFT'm, TFTref may be driven.

Figure 10A:
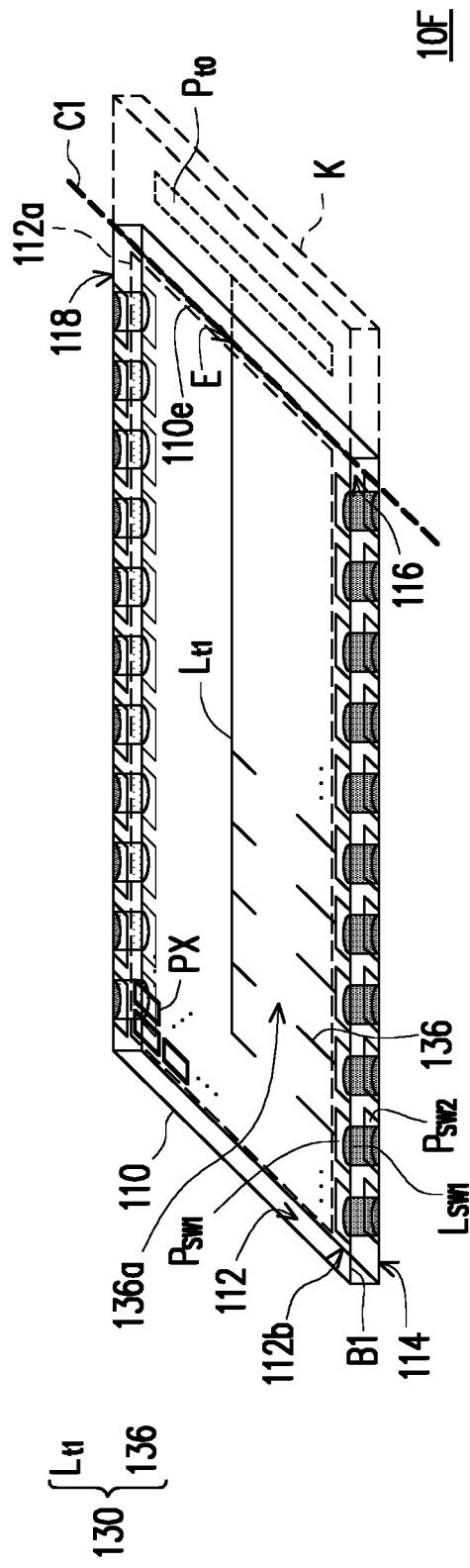
FIG. 10A is a diagram of a pixel array substrate 10F of an embodiment of the invention.

FIG. 10A is a diagram of a pixel array substrate 10F of an embodiment of the invention. In particular, FIG. 10A shows the first surface 112 of the base 110 of the pixel array substrate 10F and the components thereon.

Figure 10B:
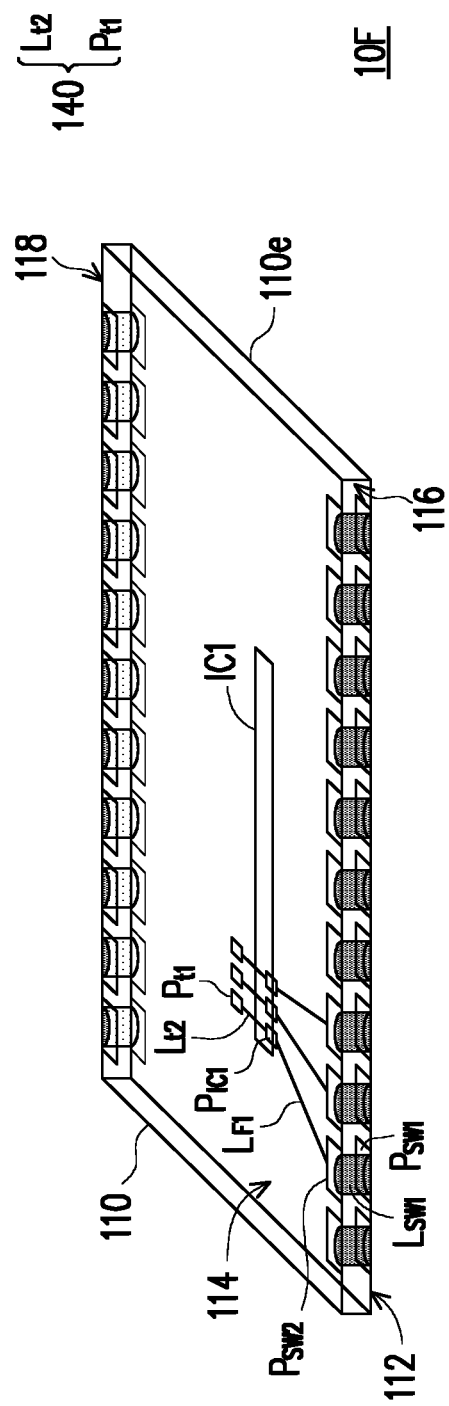
FIG. 10B is a diagram of the pixel array substrate 10F of an embodiment of the invention.

FIG. 10B is a diagram of the pixel array substrate 10F of an embodiment of the invention. In particular, FIG. 10B shows the second surface 114 of the base 110 of the pixel array substrate 10F and the components thereon.

The pixel array substrate 10F of the present embodiment is similar to the pixel array substrate 10 of FIG. 1A and FIG. 1B, and the difference between the two is: the first testing element 130 of the pixel array substrate 10F is different from the first testing element 130 of FIG. 1A and FIG. 1B.

Please refer to FIG. 10A and FIG. 10B. Specifically, in the present embodiment, the first testing element 130 includes the first testing line $L_{t1}$ and a plurality of wires 136. The plurality of wires 136 are disposed between the first testing line $L_{t1}$ and the plurality of first bonding pads $P_{SW1}$.

If the block K and the components thereon shown by the dashed line in FIG. 10A are ignored, FIG. 10A and FIG. 10B show the finished pixel array substrate 10F. In the finished pixel array substrate 10F, the end E of the first testing line $L_{t1}$ is substantially aligned with the edge 110e of the base 110, and each of the wires 136 has a disconnection 136a from the first testing line $L_{t1}$.

It should be noted that in the manufacturing process of the pixel array substrate 10F, the block K and the base 110 are originally the same base material. In the manufacturing process of the pixel array substrate 10F, the plurality of pixel structures PX, the plurality of first bonding pads $P_{SW1}$, the first testing element 130, and the testing pad $P_{t0}$ located on the block K are formed on the front surface of the base material, wherein the first testing line $L_{t1}$ of the first testing element 130 passes through the predetermined cutting path C1 and is electrically connected to the testing pad $P_{t0}$, the plurality of wires 136 are electrically connected to the same first testing line $L_{t1}$, and the plurality of wires 136 are respectively electrically connected to the plurality of first bonding pads $P_{SW1}$; in addition, the plurality of second bonding pads $P_{SW2}$, the second testing element 140, the plurality of first chip pads $P_{IC1}$, and the plurality of first fan-out traces $L_{F1}$ are also formed on the back surface of the base material; then, the plurality of first wirings $L_{SW1}$ are formed on the sidewall of the base material.

After the plurality of first wirings $L_{SW1}$ are formed, a testing step is performed to test whether the plurality of first wirings $L_{SW1}$ may be operated normally. In particular, during the testing step, the plurality of wires 136 are electrically connected to the same first testing line $L_{t1}$, and the plurality of wires 136 are respectively electrically connected to the plurality of first bonding pads $P_{SW1}$. For example, in the present embodiment, a signal may be input to the testing pad $P_{t0}$ located on the block K, and a plurality of signals of the plurality of first testing pads $P_{t1}$ may be received at different time points. According to the plurality of signals of the plurality of first testing pads $P_{t1}$, whether the plurality of first wirings $L_{SW1}$ respectively corresponding to the plurality of first testing pads $P_{t1}$ may be operated normally may be determined.

After the above testing step is completed, a cutting process is performed along the cutting path C1 to remove the block K. When the block K is removed, the first testing line $L_{t1}$ passing through the cutting path C1 is cut off. Therefore, on the finished pixel array substrate 10F, the end E of the first testing line $L_{t1}$ is substantially aligned with the edge 110e of the base 110. In addition, after the above testing step is completed, the plurality of wires 136 originally electrically connected to the same first testing line $L_{t1}$ are disconnected from the first testing line $L_{t1}$, and each of the wires 136 has the disconnection 136a from the first testing line $L_{t1}$, so that in the finished pixel array substrate 10F, the plurality of first bonding pads $P_{SW1}$ may be used to transmit respective signals.

What is claimed is:

1. A pixel array substrate, comprising:
    a base having a first surface, a second surface, and a first sidewall, wherein the first sidewall is disposed between the first surface and the second surface, and the first surface has an active area and a peripheral region outside the active area;
    a plurality of pixel structures disposed on the active area of the first surface;
    a plurality of first bonding pads disposed on the peripheral region of the first surface and electrically connected to the pixel structures;
    a plurality of second bonding pads disposed on the second surface;
    a plurality of first wirings, wherein each of the first wirings is disposed on a corresponding first bonding pad, the first sidewall, and a corresponding second bonding pad, and electrically connected to the corresponding first bonding pad and the corresponding second bonding pad;
    a first testing element disposed on the active area of the first surface and having a first testing line, wherein the first testing line is electrically connected to at least one of the first bonding pads, and an end of the first testing line is substantially aligned with an edge of the base;
    a second testing element disposed on the second surface, wherein the second testing element has a plurality of second testing lines and a plurality of first testing pads, the second bonding pads are respectively electrically connected to the second testing lines, and the second testing lines are respectively electrically connected to the first testing pads;
    a plurality of first chip pads disposed on the second surface of the base and electrically connected to the second bonding pads; and
    a first driver chip disposed on the first chip pads and electrically connected to the first chip pads, wherein the first testing pads are disposed outside an area occupied by the first chip pads and the first driver chip.

2. The pixel array substrate of claim 1, further comprising:
    a plurality of first fan-out traces disposed on the second surface of the base and respectively electrically connected to the second bonding pads, wherein the first chip pads are respectively electrically connected to the first fan-out traces, and the first chip pads are located between the first testing pads and the first fan-out traces.

3. The pixel array substrate of claim 1, wherein the first surface and the first sidewall have a first boundary, the first wirings are disposed on the first boundary, and the edge of the base substantially aligned with the end of the first testing line is staggered with the first boundary.

4. A pixel array substrate, comprising:
    a base having a first surface, a second surface, and a first sidewall, wherein the first sidewall is disposed between the first surface and the second surface, and the first surface has an active area and a peripheral region outside the active area;

a plurality of pixel structures disposed on the active area of the first surface;

a plurality of first bonding pads disposed on the peripheral region of the first surface and electrically connected to the pixel structures;

a plurality of second bonding pads disposed on the second surface;

a plurality of first wirings, wherein each of the first wirings is disposed on a corresponding first bonding pad, the first sidewall, and a corresponding second bonding pad, and electrically connected to the corresponding first bonding pad and the corresponding second bonding pad;

a first testing element disposed on the active area of the first surface and having a first testing line, wherein the first testing line is electrically connected to at least one of the first bonding pads, and an end of the first testing line is substantially aligned with an edge of the base; and a second testing element disposed on the second surface, wherein the second testing element has a plurality of second testing lines and a plurality of first testing pads, the second bonding pads are respectively electrically connected to the second testing lines, and the second testing lines are respectively electrically connected to the first testing pads;

wherein the base further has a second sidewall, the second sidewall is disposed opposite to the first sidewall and between the first surface and the second surface, and the pixel array substrate further comprises:

a plurality of third bonding pads disposed on the peripheral region of the first surface;

a plurality of fourth bonding pads disposed on the second surface; and a plurality of second wirings, wherein each of the second wirings is disposed on a corresponding third bonding pad, the second sidewall, and a corresponding fourth bonding pad, and electrically connected to the corresponding third bonding pad and the corresponding fourth bonding pad, wherein the first testing line is electrically connected to a first bonding pad and a third bonding pad corresponding to each other.

5. The pixel array substrate of claim 4, wherein the first testing line has a first portion extended in a first direction and a second portion extended in a second direction, the first direction is staggered with the second direction, the first portion has the end aligned with the edge of the base, and the second portion is connected to the first bonding pad and the third bonding pad corresponding to each other.

6. The pixel array substrate of claim 4, wherein the second testing element further comprises:

a plurality of third testing lines, wherein the fourth bonding pads are respectively electrically connected to the third testing lines; and a plurality of second testing pads, wherein the third testing lines are respectively electrically connected to the second testing pads.

7. The pixel array substrate of claim 4, wherein the second testing element further comprises:

a plurality of third testing lines, wherein the fourth bonding pads are respectively electrically connected to the third testing lines, the third testing lines are respectively electrically connected to the first testing pads, and the second testing lines and the third testing lines are respectively located on opposite sides of the first testing pads.

8. The pixel array substrate of claim 1, wherein the first testing element further comprises:

a testing shunt element, wherein the first testing line is electrically connected to the testing shunt element; and a plurality of wires, wherein the testing shunt element is electrically connected to the wires, and the wires are respectively electrically connected to the first bonding pads.

9. The pixel array substrate of claim 1, wherein the first testing element further comprises:

a plurality of wires disposed between the first testing line and the first bonding pads, wherein each of the wires has a disconnection from the first testing line.

10. A pixel array substrate, comprising:

a base having a first surface, a second surface, a first sidewall, and a second sidewall, wherein the first sidewall is disposed between the first surface and the second surface, the second sidewall is disposed opposite to the first sidewall and between the first surface and the second surface, and the first surface has an active area and a peripheral region outside the active area;

a plurality of pixel structures disposed on the active area of the first surface;

a plurality of first bonding pads electrically connected to the pixel structures and disposed on the peripheral region of the first surface;

a plurality of second bonding pads disposed on the second surface;

a plurality of first wirings, wherein each of the first wirings is disposed on a corresponding first bonding pad, the first sidewall, and a corresponding second bonding pad, and electrically connected to the corresponding first bonding pad and the corresponding second bonding pad;

a plurality of third bonding pads electrically connected to the pixel structures and disposed on the peripheral region of the first surface;

a plurality of fourth bonding pads disposed on the second surface;

a plurality of second wirings, wherein each of the second wirings is disposed on a corresponding third bonding pad, the second sidewall, and a corresponding fourth bonding pad, and electrically connected to the corresponding third bonding pad and the corresponding fourth bonding pad;

a first testing element disposed on the active area of the first surface and having a first testing line, wherein the first testing line is electrically connected to a corresponding first bonding pad and a corresponding third bonding pad;

a second testing element disposed on the second surface, wherein the second testing element has a plurality of second testing lines, a plurality of first testing pads, a plurality of third testing lines, and a plurality of second testing pads, the second bonding pads are respectively electrically connected to the second testing pads, the second testing lines are respectively electrically connected to the first testing pads, the fourth bonding pads are respectively electrically connected to the third testing lines, and the third testing lines are respectively electrically connected to the second testing pads;

a plurality of first chip pads disposed on the second surface of the base and respectively electrically connected to the second bonding pads; and a first driver chip disposed on the first chip pads and electrically connected to the first chip pads;

wherein the first testing pads and the second testing pads are disposed outside an area occupied by the first chip pads and the first driver chip.

11. The pixel array substrate of claim 10, further comprising:
a plurality of first fan-out traces disposed on the second surface of the base, wherein the second bonding pads are respectively electrically connected to the first fan-out traces, the first fan-out traces are respectively electrically connected to the first chip pads, and the first chip pads are located between the first fan-out traces and the first testing pads.

12. The pixel array substrate of claim 10, further comprising:
a plurality of second chip pads disposed on the second surface of the base and respectively electrically connected to the fourth bonding pads; and
a second driver chip disposed on the second chip pads and electrically connected to the second chip pads;
wherein the first testing pads and the second testing pads are disposed outside an area occupied by the second chip pads and the second driver chip.

13. The pixel array substrate of claim 12, further comprising:
a plurality of first fan-out traces disposed on the second surface of the base, wherein the second bonding pads are respectively electrically connected to the first fan-out traces, the first fan-out traces are respectively electrically connected to the first chip pads, and the first chip pads are located between the first fan-out traces and the first testing pads; and
a plurality of second fan-out traces disposed on the second surface of the base, wherein the fourth bonding pads are respectively electrically connected to the second fan-out traces, the second fan-out traces are respectively electrically connected to the second chip pads, and the second chip pads are located between the second fan-out traces and the second testing pad.

14. A pixel array substrate, comprising:
a base having a first surface, a second surface, and a first sidewall, wherein the first sidewall is disposed between the first surface and the second surface, and the first surface has an active area and a peripheral region outside the active area;
a plurality of pixel structures disposed on the active area of the first surface;
a plurality of first bonding pads disposed on the peripheral region of the first surface and electrically connected to the pixel structures;
a plurality of second bonding pads disposed on the second surface;
a plurality of first wirings, wherein each of the first wirings is disposed on a corresponding first bonding pad, the first sidewall, and a corresponding second bonding pad, and electrically connected to the corresponding first bonding pad and the corresponding second bonding pad;
a first testing element disposed on the active area of the first surface and having a first testing line, wherein the first testing line is electrically connected to at least one of the first bonding pads, and in a top view of the pixel array substrate, an end of the first testing line is substantially aligned with an edge of the base; and
a second testing element disposed on the second surface, wherein the second testing element has a plurality of second testing lines and a plurality of first testing pads, the second bonding pads are respectively electrically connected to the second testing lines, and the second testing lines are respectively electrically connected to the first testing pads.

* * * * *